United States Patent
Savelli et al.

(10) Patent No.: US 9,200,967 B2
(45) Date of Patent: Dec. 1, 2015

(54) THERMOELECTRIC DEVICE WHICH PROVIDES FOR VARYING THE EFFECTIVE HEIGHT OF THE CONTACTS OF A THERMOCOUPLE, AND METHOD FOR MANUFACTURING THE DEVICE

(75) Inventors: Guillaume Savelli, Grenoble (FR); Philippe Coronel, Barraux (FR); Marc Plissonnier, Eybens (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 237 days.

(21) Appl. No.: 13/696,239

(22) PCT Filed: May 3, 2011

(86) PCT No.: PCT/FR2011/000269
§ 371 (c)(1),
(2), (4) Date: Jan. 2, 2013

(87) PCT Pub. No.: WO2011/138521
PCT Pub. Date: Nov. 10, 2011

(65) Prior Publication Data
US 2013/0100985 A1    Apr. 25, 2013

(30) Foreign Application Priority Data
May 5, 2010    (FR) ...................................... 10 01930

(51) Int. Cl.
*H01L 35/00*    (2006.01)
*G01K 7/02*    (2006.01)
(Continued)

(52) U.S. Cl.
CPC *G01K 7/02* (2013.01); *H01L 35/06* (2013.01); *H01L 35/32* (2013.01)

(58) Field of Classification Search
CPC ......... H01L 35/04; H01L 35/06; H01L 35/10; H01L 35/32; H01L 35/02; H01L 35/08; G01K 7/02
See application file for complete search history.

(56) References Cited

U.S. PATENT DOCUMENTS

| | | | |
|---|---|---|---|
| 3,197,343 A * | 7/1965 | Palmatier ...................... | 136/212 |
| 3,377,206 A * | 4/1968 | Reimer Emeis et al. ..... | 136/212 |
| 6,410,971 B1 | 6/2002 | Otey | |

(Continued)

FOREIGN PATENT DOCUMENTS

| CN | 1541422 A | 10/2004 |
|---|---|---|
| CN | 101217177 A | 7/2008 |

(Continued)

OTHER PUBLICATIONS

Author Unknown, The Engineering Toolbox: Coefficients of Linear Expansion, Archived to Feb. 12, 2010.*

(Continued)

*Primary Examiner* — Eli Mekhlin
(74) *Attorney, Agent, or Firm* — Oliff PLC

(57) ABSTRACT

The thermoelectric device includes a first leg made from a first material, anchored at the level of its first end to a support, and a second leg made from a second material, anchored at the level of its first end to said support. In addition, an electric connecting element provided with first and second contact areas is respectively in electric contact with the first leg and second leg so as to form a thermocouple. The device includes means for varying the position of the first and contact areas at the level of the first and second legs.

11 Claims, 9 Drawing Sheets

(51) Int. Cl.
*H01L 35/06* (2006.01)
*H01L 35/32* (2006.01)

(56) References Cited

U.S. PATENT DOCUMENTS

2005/0016183 A1* 1/2005 Tateyama et al. ............... 62/3.7
2006/0042676 A1   3/2006 Sogou et al.

FOREIGN PATENT DOCUMENTS

JP   A-2007-35974    2/2007
JP   A-2008-288535  11/2008

OTHER PUBLICATIONS

Böttner, "Micropelt Miniaturized Thermoelectric Devices: Small Size, High Cooling Power Densities, Short Response Time," 2005 International Conference on Thermoelectrics.

Mingo et al., "'Nanoparticle-in-Alloy' Approach to Efficient Thermoelectrics: Silicides in SiGe," *2009 American Chemical Society, NANO LETTERS*, Jan. 7, 2009, vol. 9, No. 2, pp. 711-715.

Jan. 23, 2015 Office Action issued in Chinese Patent Application No. 201180033345.1.

* cited by examiner

US 9,200,967 B2

THERMOELECTRIC DEVICE WHICH PROVIDES FOR VARYING THE EFFECTIVE HEIGHT OF THE CONTACTS OF A THERMOCOUPLE, AND METHOD FOR MANUFACTURING THE DEVICE

BACKGROUND OF THE INVENTION

The invention relates to a thermoelectric device comprising:
a first leg made from a first material, anchored at the level of its first end to a support,
a second leg made from a second material, anchored at the level of its first end to said support,
an electric connecting element provided with first and second contact areas respectively in electric contact with the first leg and the second leg so as to form a thermocouple.

STATE OF THE ART

A conventional architecture of a thermoelectric device with two thermocouples 1a, 1b is illustrated in FIG. 1. Each thermocouple 1a, 1b is formed by two legs 2a, 2b connected to one another at one of their ends by an electric connecting element 3. A first leg 2a is preferably formed from a P-type material and a second leg 2b is preferably formed from an N-type material. The device can comprise a plurality of thermocouples 1a, 1b as described above placed in series and connected to one another by metal connectors 4a to optimize the efficiency of the device. Metal connectors 4b, 4c are located at the ends of the series of thermocouples to form the electric connections of the device.

The thermoelectric device can be used either in Seebeck mode or in Peltier mode. It comprises a hot side reservoir 5 at a temperature $T_h$ and a cold side reservoir 6 at a temperature $T_f$.

In Seebeck mode, the device produces energy from a temperature gradient between the hot side 5 and cold side 6. This mode is also called power generator mode.

In Peltier mode, application of a current at the terminals of the device enables a temperature gradient to be generated between the hot side 5 and cold side 6. This mode is also called cooling mode.

The efficiency of the thermoelectric device does in fact depend on the materials used, on the geometry of the device, and on the environment of use. A device is thus either optimized for cooling mode or used for power generator mode, but never for both at the same time.

The document JP-2008-288535-A describes a thermoelectric module comprising thermocouples electrically connected in series and thermally connected in parallel between a cold side and a hot side. Each thermocouple is formed by a basis of two legs made from different materials and arranged between two supports. At the level of the hot side, the legs of each thermocouple comprise notches between which elastic biasing means such as a compression spring are arranged. These biasing means are insulated from the support and are in contact with two elements which are themselves in contact with the legs. The elastic biasing means enable a stable and permanent electric contact to be made between the legs, in a direction perpendicular to the legs, in case of dilatation or thermal stress of the thermoelectric module.

OBJECT OF THE INVENTION

The object of the invention is to provide a device that can be optimized both for power generator mode and for cooling mode.

This objective tends to be achieved by the appended claims and in particular by the fact that the means for varying the position of the contact areas comprise the electric connecting element, said connecting element being movable along said first and second legs.

The invention also relates to a fabrication method of a thermoelectric device comprising the following steps:
forming of two legs made from thermoelectric material, electrically insulated from one another, on a support substrate,
forming of a movable element electrically connecting the two legs and being able to move in a direction perpendicular to the substrate.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

The embodiments described in the following enable the effective height of the legs to be modified to optimize either generator mode or cooling mode within one and the same thermocouple.

Figure 1:
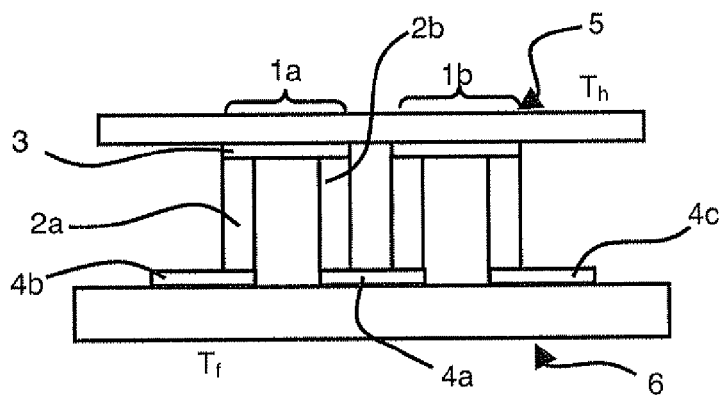
FIG. 1 illustrates a device according to the prior art equipped with two thermocouples connected in series.
Figure 2:
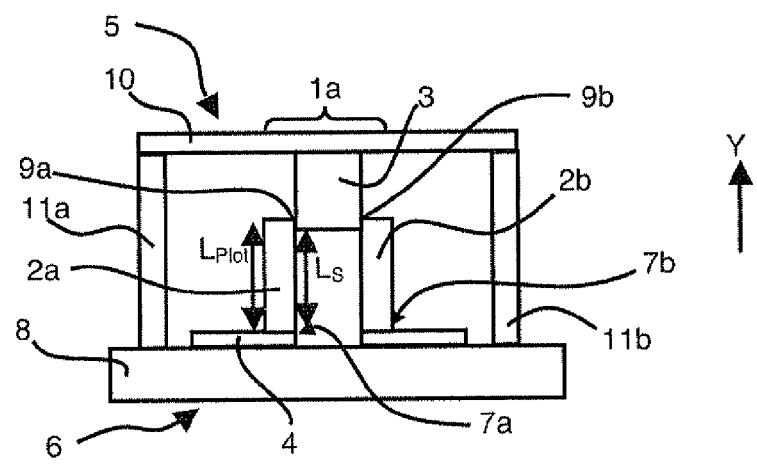
FIG. 2 illustrates an embodiment of a device according to the invention in Seebeck optimized position.

According to a first embodiment illustrated in FIG. 2, the thermoelectric device comprises a first leg 2a made from a first material, and a second leg 2b made from a second material. First leg 2a is anchored at the level of its first end 7a to a support 8, and second leg 2b is anchored at the level of its first end 7b to said support 8. A metal connector 4 is preferably fitted at the level of each leg between the corresponding first end 7a, 7b and support 8. These connectors for example enable several thermocouples of the device to be connected in series if required. An electric connecting element 3 connects first and second legs 2a, 2b so as to form a thermocouple 1a. This electric connecting element 3 is provided with first and second contact areas 9a, 9b respectively in electric contact with first leg 2a and second leg 2b. Legs 2a, 2b are preferably formed from two different materials enabling a thermocouple to be formed. These legs 2a, 2b can be formed from the same thermoelectric material, the first leg being N-doped and the second leg being P-doped. The thermoelectric material can also be a semi-metal such as bismuth, antinomy, etc., or a degenerated semiconductor such as silicon, a silicon and germanium alloy, etc.

The device further comprises means for varying the position of first and second contact area 9a, 9b at the level of first and second legs 2a, 2b. This in fact enables the effective height of the legs to be made to vary by modulating the length of the electric path between first end 7a, 7b of each leg 2a, 2b and the associated contact area 9a, 9b. In other words, electric connecting element 3 is able to move so as to move contact areas 9a, 9b away from or towards support 8, i.e. along the Y axis in FIG. 2.

In FIG. 2, the device favours Seebeck mode, the effective height of first and second legs 2a, 2b is equal to $L_S$ which corresponds to the length of the electric path between first end 7a, 7b of a leg 2a, 2b and contact area 9a, 9b associated with said leg of electric connecting element 3. Preferably, the height $L_S$ is smaller than or equal to the real height $L_{Leg}$ of legs 2a, 2b.

Figure 3:
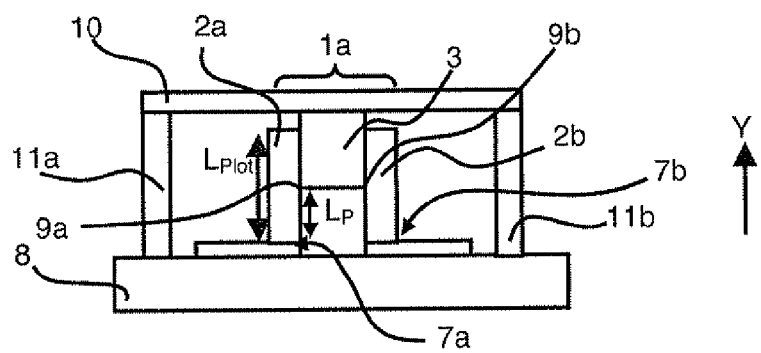
FIG. 3 illustrates the device of FIG. 2 in Peltier optimized position.

In FIG. 3, the device is optimized in Peltier mode, and the effective height of first and second leg 2a, 2b is therefore defined by the length of the electric path between first end 7a, 7b of a leg 2a, 2b and contact area 9a, 9b associated with said leg of electric connecting element 3. In FIG. 3, this effective height is equal to $L_P$, $L_P$ being less than $L_S$.

In FIGS. 2 and 3, the distance between first end 7a, 7b of a leg 2a, 2b and the associated contact area 9a, 9b is calculated from a part of contact area 9a, 9b that is nearest to first end 7a, 7b.

In other words, these means for varying the position of first and second contact areas 9a, 9b at the level of first and second legs 2a, 2b in fact enable the effective height of first and second legs 2a, 2b to be modulated. The device is thus able to adapt to the external environment, for example the temperature between hot side 5 and cold side 6, to optimize the selected operating mode.

For example, it is possible to characterize a device taking account of the parameters defined below in table I:

TABLE I

| Type | Parameter | Variable | Values |
|---|---|---|---|
| Thermal parameters | Hot reservoir temperature | $T_h$ | 350 K |
| | Cold reservoir temperature | $T_f$ | 300 K |
| Material parameters | Seebeck coefficient | S | 4.00E−04 V/K |
| | Thermal conductivity | λ | 1.5 W/m/K |
| | Electric resistivity | ρ | 1.60E−05 Ω·m |
| | Matrix thermal conductivity | $λ_{air}$ | 0.026 W/m/K |
| Geometric parameters | Number of legs | n | VAR |
| | Leg-edge of device separation | distance | 1.00E−04 m |
| | Length and thickness of legs | L | 4.00E−05 m |
| | Leg size | b | 8.00E−06 m |
| | Surface of legs | $A_{np}$ | 6.40E−11 m² |
| | Space between two legs | d | VAR in m |
| | Module surface | $A_{te}$ | 1.00E−04 m² |
| Heat exchange parameters | Thermal diffusion surface | $A_{hs}$ | 2.00E−04 m² |
| | Heat transfer coefficient | h | 1.00E+03 W/m²/K |
| Electric parameters | Contact resistance | $R_c$ | 1.00E−11 Ω·m² |
| | Internal resistance of the device | $R_{int}$ | VAR in Ω |

In this table, the thermal parameters define the temperatures at the terminals of the device (hot side $T_h$ and cold side $T_f$ of the thermocouples in Kelvin).

The material parameters define the characteristics of the materials used to form the legs such as the Seebeck coefficient, thermal conductivity, electric resistivity, and also the thermal conductivity of the matrix which corresponds to the filling material between the legs (in the example the material involved is air).

The geometric parameters define the device by the number n of legs (with n/2 being equal to the number N of thermocouples), the height L of the legs, the cross-section $A_{np}$ of the legs defined in the present case by a square having sides with a dimension b, the space d between two adjacent legs, the surface of the device $A_{te}$ on which the legs are distributed, and the distance between the outermost legs and the edge of the device (the edge-leg distance necessary for technological fabrication considerations).

The heat exchange parameters are the heat exchange surface $A_{hs}$ and the transfer coefficient h between the device and the environment (cold side).

The electric parameters define the electric contact resistance $R_c$ corresponding to the electric resistance between a leg and its connecting element, and the internal resistance $R_{int}$ corresponding to the internal resistance of the device measured at the terminals of the series of thermocouples comprising the contact resistances and the electric resistances of the legs.

With such parameters, the electric power in Seebeck mode and the cooling power in Peltier mode can be written in the form of equations. The equations that follow are based on a model taking account of the parameters involved from an electric and thermal point of view, and of the parameters linked to the environment in which the device will be placed. The temperature available for use of the cold side is in fact a temperature $T_f$ that does not really correspond to the cold temperature of the thermocouple, which is in fact at a higher temperature $T_c$ than the temperature $T_f$. It is therefore the temperature difference of the device $T_h$-$T_c$ that is taken into account in the equations and not the temperature difference of the environment $T_h$-$T_f$.

In the example and according to the characteristics of table I, the hot side $T_h$ and cold side $T_f$ are respectively at temperatures of 350 Kelvin and 300 Kelvin. The surface of module $A_{te}$ is imposed at 1 cm² on which 42,000 legs are arranged, i.e. 21,000 thermocouples, each leg having a cross-section in the form of an 8×8 µm² square. Finally the parameters relating to the heat exchanger have a surface $A_{hs}$ of 2 cm² and a heat transfer coefficient of 1000 W*m$^{-2}$*K$^{-1}$.

The electric power $Q_{gen}$ in Seebeck mode can therefore be expressed according to the equation:

$$Q_{gen} = \frac{N^2 \times S^2 \times (T_h - T_c(L))^2}{4 R_{int}^2(L) \times A_{hs}} \quad (1)$$

In the equation (1), $T_c$ is an unknown and depends on L, as is the internal resistance $R_{int}$, and N represents the number of thermocouples (N=n/2).

$R_{int}$ can be defined according to the equation:

$$R_{int}(L) = 2N \times \left( \frac{\rho \times L}{A_{np}} + \frac{2 R_c}{A_{np}} \right) \quad (2)$$

To know the expression of $T_c$, the equation has to be written presenting the balance of powers input at the level of the thermoelectric device with the heat leaving the cold side i.e.:

$$P_{Seeb} + P_{cond} + P_j = P_{hs} \quad (3)$$

where $P_{Seeb}$ represents the Seebeck effect, $P_{cond}$ represents the heat transfer by conduction, $P_j$ the losses by Joule effect and $P_{hs}$ the heat transfer by convection. These four terms make use of $T_c$, and result in solving of the equation:

$$\left( \frac{2N \times \lambda \times \Delta T \times A_{np}}{L} + \frac{\lambda_{air} \times \Delta T \times (A_{te} - 2NA_{np})}{L} \right) + N \times S \times T_c \times I + \frac{1}{2} R_{int} \times I^2 = (T_c - T_f) h A_{hs} \quad (4)$$

where $\Delta T$ represents the temperature difference between $T_h$ and $T_c$, $\lambda_{air}$ the thermal conductivity of the air, and I the current flowing through the thermocouples.

Figure 4:
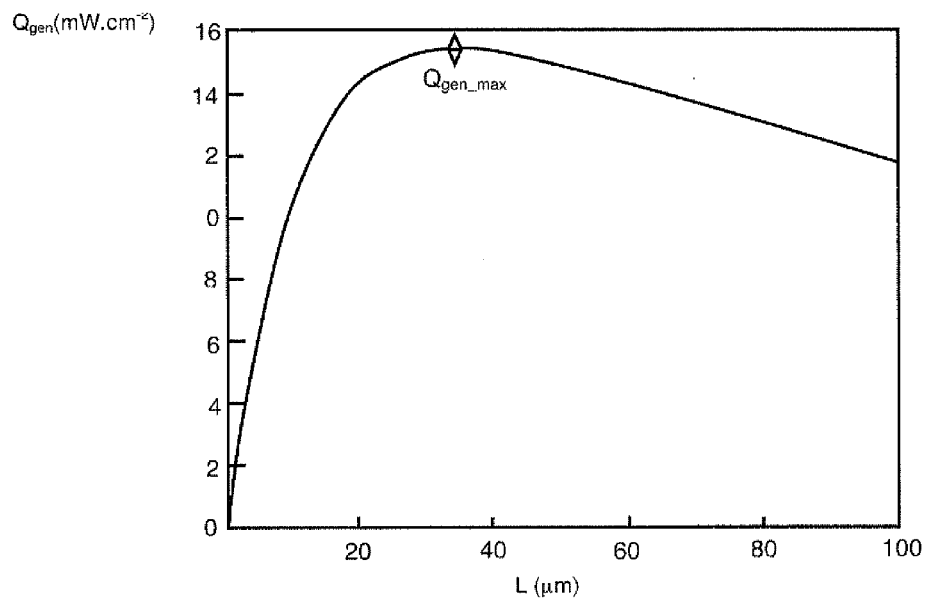
FIG. 4 illustrates the power generated by the device in Seebeck mode according to the height of the legs.

This equation (4) shows that $T_c$ is also a function of the parameter L. Equations (1) and (4) thus demonstrate the dependence of $Q_{gen}$ according to the height L of the legs. According to the variables fixed in table I, FIG. 4 illustrates the variation of $Q_{gen}$ versus the effective height of the legs. In this figure, a point $Q_{gen\_max}$ of 15.4 mW·cm$^{-2}$ can be observed for a leg height of 35 μm.

This value $N_{Seeb}$ can also be obtained analytically by solving the equation:

$$\left( \frac{\partial (Q_{gen})_{max}}{\partial L} \right)_{L=L_{Seeb}} = 0 \quad (5)$$

$$= \left( \frac{\partial \left( \frac{N^2 \times S^2 \times (T_h - T_c(L))^2}{4 \times (R_{int}(L))^2 \times A_{hs}} \right)}{\partial L} \right)_{L=L_{Seeb}}$$

Tests were also performed for Peltier mode. Taking account of the Peltier effect, Joule effect and the thermal conduction, the cooling power of a thermoelectric device favouring Peltier effect can be written in the form:

$$Q_{cold} = N \times S \times I \times T_c(L) - \frac{1}{2} R_{int}(L) \times I(L)^2 - K(L) \times (T_h - T_c(L)) \quad (6)$$

This equation (6) also makes use of the variable L representative of the height of the legs, I the current flowing through the series of thermocouples, and where K(L) represents the total thermal conductance defined by:

$$K(L) = \frac{2N \times \lambda \times A_{np}}{L} + \frac{\lambda_{air} \times (A_{te} - 2N \times A_{np})}{L} \quad (7)$$

Figure 5:
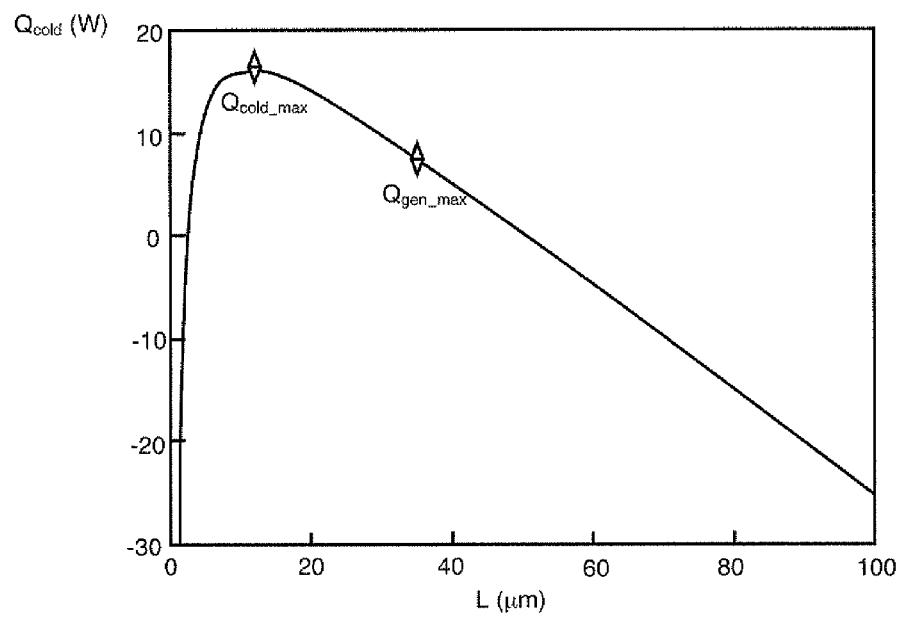
FIG. 5 illustrates the power generated by the device in Peltier mode according to the height of the legs.

By application of equations (6) and (7), FIG. 5 represents the variation of $Q_{cold}$ according to the height L of the legs. In the present case, the input parameters are different from Seebeck mode. Thus, an input current equal to 10 mA is flowing through the series of thermocouples.

Under these conditions, if the height of the legs was equal to the height previously determined for Seebeck mode, a power $Q_{cold}$ of 7.6 W would be obtained. Reading of the curve of FIG. 5 shows that this value of 7.6 W is far from being optimal. Indeed, FIG. 5 shows well that a smaller leg height enables an optimum power $Q_{cold\_max}$ of 16.2 W to be obtained. This Peltier optimized leg height is 11 μm, and is in fact much smaller than that necessary to optimize the same thermoelectric device for Seebeck effect.

This demonstration therefore validates the particular advantages presented by the device the thermocouple of which comprises legs with a variable effective height, and the gain it can provide by being selectively optimized for Seebeck mode or for Peltier mode.

According to a particular example embodiment, the means for varying the position of first and second areas 9a, 9b comprise the electric connecting element 3. The connecting element 3 is then movable along said legs 2a, 2b. In this example embodiment, it is therefore the mobility of connecting element 3 that enables the effective height of legs 2a, 2b to be modulated as represented in FIGS. 2 and 3.

In the example embodiments of FIGS. 2 and 3, movable connecting element 3 can be supported by a membrane 10, deformation of which membrane enables sliding of the connecting element 3 along first and second legs 2a, 2b. Membrane 10 can be connected to support 8 by at least one pillar 11a, 11b (in FIGS. 2 and 3, the device comprises two pillars arranged on each side of legs 2a, 2b). Naturally this is only a particular example of an embodiment, the person skilled in the art being able to adapt operation of the membrane by any other type of means enabling for example connecting element 3 to slide between legs 2a, 2b in a longitudinal direction of said legs, i.e. along the Y axis in FIGS. 2 and 3.

When thermocouple 1a is in operation, electric contact between connecting element 3 and first and second legs 2a, 2b is ensured, both in the top position and in the bottom position (Seebeck or Peltier mode). In certain cases, design errors when the device is fabricated do not enable a perfect equidistance between first and second legs 2a, 2b to be ensured, which may then induce such a functional clearance between connecting element 3 and first and second legs 2a, 2b. This functional clearance causes a loss of electric contact between connecting element 3 and first and second legs 2a, 2b of the thermocouple, which then becomes unusable. In the same way, a design error leading to locally place first and second legs 2a, 2b closer together, would be liable to damage the thermocouple when sliding of electric connecting element 3 takes place to move from the Seebeck position to the Peltier position, or vice-versa.

Connecting element 3 can therefore comprise means for varying its thickness in one direction (along the X axis in FIGS. 6 and 7) perpendicular to its sliding direction (along the Y axis of FIGS. 6 and 7) and situated in a plane parallel to the plane of first and second legs 2a, 2b. The means for varying the thickness of connecting element 3 can comprise a material 12 that is able to change volume by the action of a stimulation, for example a temperature change or application of a predefined voltage. The change of volume is naturally reversible to enable electric contact between legs 2a, 2b and connecting element 3 when material 12 is dilated, and to enable connecting element 3 to slide when material 12 is retracted. For example purposes, Nafion®, Lipon®, or polypyrrole can be used under certain conditions. The stimulations can be electric, thermal or optic.

Figure 6:
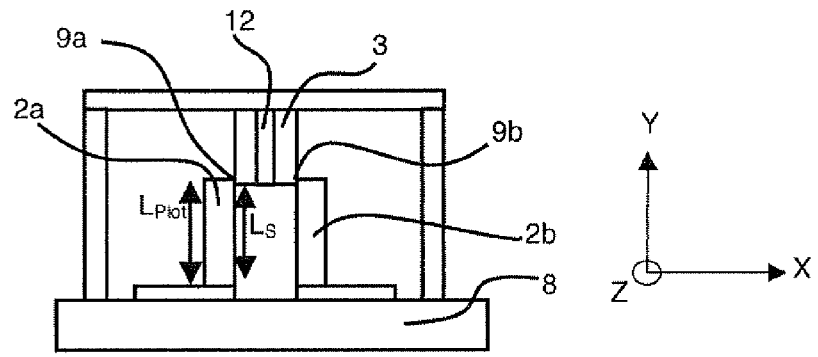
FIGS. 6 and 7 illustrate an improvement of the embodiment of FIGS. 2 and 3.
Figure 7:
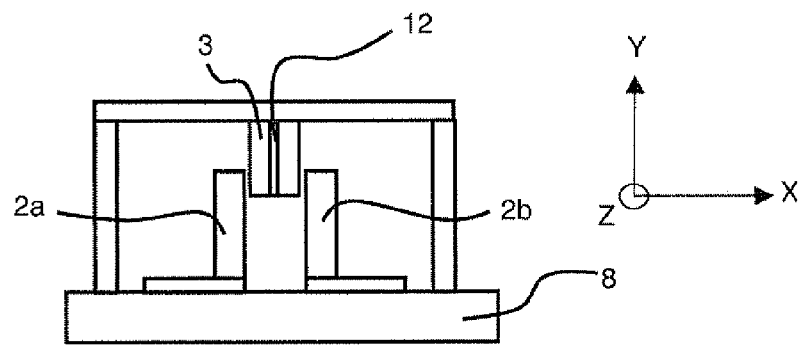

Material 12 able to change volume is for example a segment made from volume change material formed in electric connecting element 3, said segment preferably being in a plane parallel to the plane comprising the sliding direction and perpendicular to the plane of first and second legs 2a, 2b. In FIG. 6, electric connecting element 3 is in the top position optimized for Seebeck mode, and contact areas 9a, 9b of electric connecting element 3 are respectively in contact with first and second legs 2a, 2b. In FIG. 7, the stimulation is applied so that the material able to change volume retracts so as to create a sufficient functional clearance between connecting element 3 and the two legs 2a, 2b to enable connecting element 3 to slide between legs 2a, 2b without damaging the latter. Electric connecting element 3 can thus be lowered in the direction of support 8 to the position optimized for Peltier mode, and the material able to change volume dilates, for example by means of a new stimulation, so that contact areas 9a, 9b of electric connecting element 3 make the electric connection at the level of legs 2a, 2b.

Figure 8:
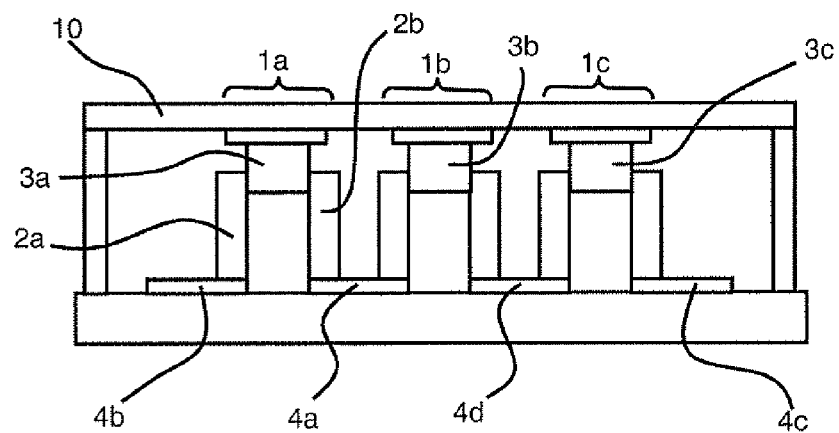
FIG. 8 illustrates a device comprising three thermocouples connected in series.

The device can also comprise several thermocouples connected to one another in a series. Such a device is illustrated in FIG. 8, membrane 10 suspended above legs 2a, 2b then comprising a plurality of electric connecting elements 3a, 3b, 3c electrically insulated from one another. In FIG. 8, three thermocouples 1a, 1b, 1c are connected in series at the level of support 8 by connectors 4a, 4b, 4c, 4d in contact with the first end of each leg.

The different embodiments are not limited to a deformable membrane comprising electric connecting elements 3 on a surface directed towards support 8. It is thus possible to use any type of means enabling movement of an electric connecting element along the legs, for example a rail able to move along the Z and/or X and/or Y axis.

Figure 9:
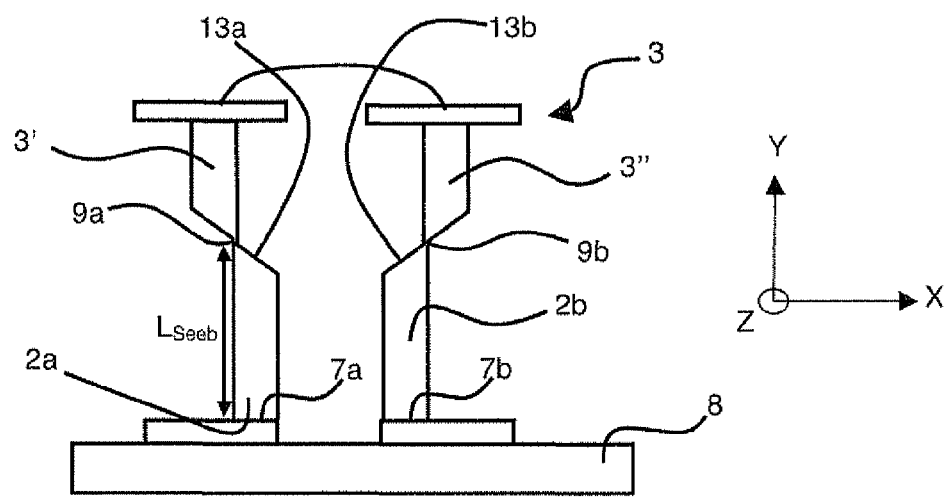
FIGS. 9 and 10 illustrate another embodiment of a thermoelectric device, respectively in Seebeck mode and in Peltier mode.
Figure 10:
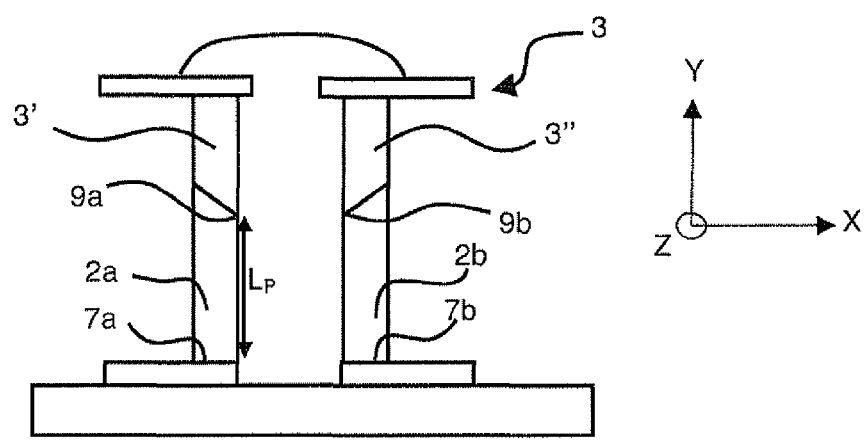

According to an example embodiment illustrated in FIGS. 9 and 10, connecting element 3 is movable and comprises two contact elements 3', 3" able to be moved independently from one another. Each leg 2a, 2b can thus be optimized individually.

For example purposes, the second end of each leg 2a, 2b is in the form of a bevel 13a, 13b, and the associated contact area 9a, 9b of connecting element 3 has the shape of a complementary bevel. It is then possible to modify the effective height of legs 2a, 2b by modifying the position of the contact areas 9a, 9b with respect to legs 2a, 2b. In FIG. 9, the device comprises a thermocouple with an electric connecting element 3 comprising two contact elements 3', 3" each provided with the contact area 9a, 9b in the Seebeck position. In FIG. 10, the same device is in the Peltier position, contact elements 3', 3" having undergone a movement towards support 8, i.e. along the X axis and the Y axis. The effective height $L_P$ is then defined by the distance separating first end of leg 7a and the nearest part (9a, 9b) of the associated contact element 3', 3".

In the examples given in the foregoing, it is the top part of the device which moves, i.e. the connecting element and associated membrane. It is naturally also possible to achieve the same type of device by fixing the connecting element and making the legs of any one thermocouple movable.

According to another example (not represented), it is also possible to form the legs on a surface of a first support, and to then form an electric connecting element on a surface of a second support designed to face the surface of the first support, the contact areas being designed to come respectively into electric contact with the first leg and the second leg. Means then simply have to be provided to modulate the distance between the surface of the first support bearing the legs and the surface of the second support bearing the electric connecting element.

The fabrication method of a thermoelectric device as defined in the foregoing comprises at least the following steps:
  forming two legs made from thermoelectric material, electrically insulated from one another on a support substrate,
  forming a movable element electrically connecting the two legs and able to move in a direction perpendicular to the substrate.

The movable connecting element can in fact be formed after the legs, from a packaging layer preferably made from sacrificial material. This packaging layer enables forming a mould at least partially delineating the movable element to be formed.

Figure 11:
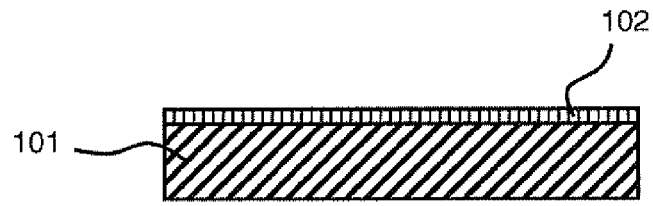
FIGS. 11 to 16 illustrate a first part of steps of a fabrication method of a thermoelectric device.
Figure 12:
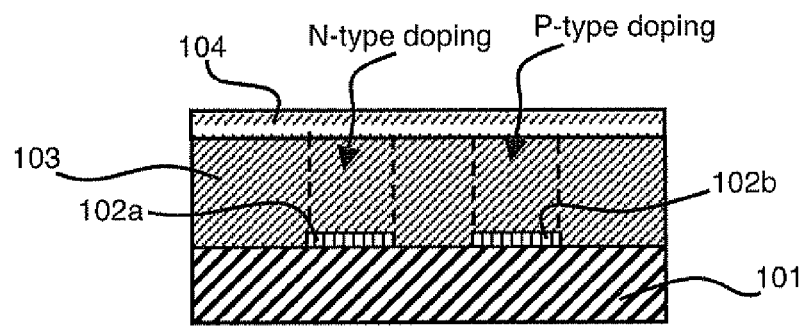

As a particular example illustrated from FIG. 11 onwards, the method can comprise formation of electric connectors 102a, 102b, on a support substrate 101, at the level of each future leg of the thermocouple. In FIGS. 11 and 12, connectors 102a, 102b are for example formed by deposition of an electrically conducting layer 102 (FIG. 11) which is then patterned so as to delineate electric connectors 102a, 102b (FIG. 12). Then a layer 103 made from a preferably thermoelectric material is deposited above connectors 102a, 102b, and is then covered by a first sacrificial layer 104, for example a layer of dielectric of a first type (FIG. 12). The thermoelectric material can be chosen from those listed in the foregoing. The thermoelectric material layer 103 can, after it has been deposited, be locally doped, for example by ion implantation, to form an N-doped leg and a P-doped leg at the level of each future thermocouple.

Figure 13:
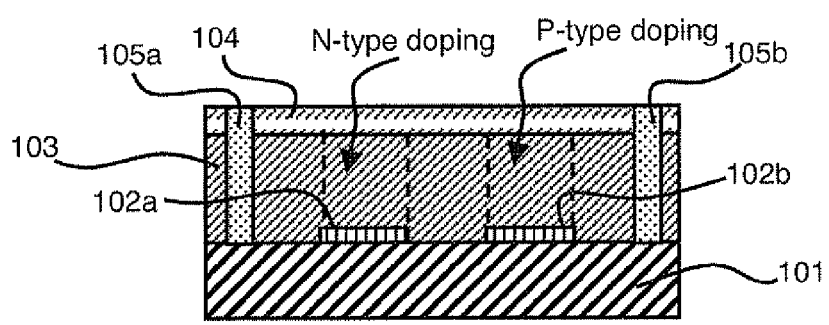

At least one membrane support pillar 105a, 105b can then be patterned (FIG. 13). This pillar can have a circular shape in the centre of which connectors 102a, 102b are arranged, or be a simple longitudinal pillar perpendicular to substrate 101, designed to support the membrane at one of its ends. In FIG. 13, two membrane support pillars 105a, 105b patterned on each side of electric connectors 102a, 102b. For example purposes, pillar or pillars 105a, 105b can be made by patterning of thermoelectric layer 103 and first sacrificial layer 104, for example by lithography and etching steps to form at least one void area (two in the case where the membrane is supported by two pillars) the bottom of which is delineated by support substrate 101. Each void area is then filled by deposition of a material designed to form pillars 105a, 105b, advantageously the material used can be conductive such as Cu, Al, TiN, or any standard metal used in micro-electronics and compatible with CVD or PVD deposition techniques. Formation of pillars 105a, 105b is preferably followed by chemical-mechanical polishing up to first sacrificial layer 104 so as to form a substantially flat surface with which first sacrificial layer 104 and the apex of pillars 105a, 105b are flush.

According to an alternative embodiment that is not represented, the pillars can also be formed in a first instance on support substrate 101, i.e. before deposition of electrically conducting layer 102, thermoelectric layer 103 and first sacrificial layer 104.

Figure 14:
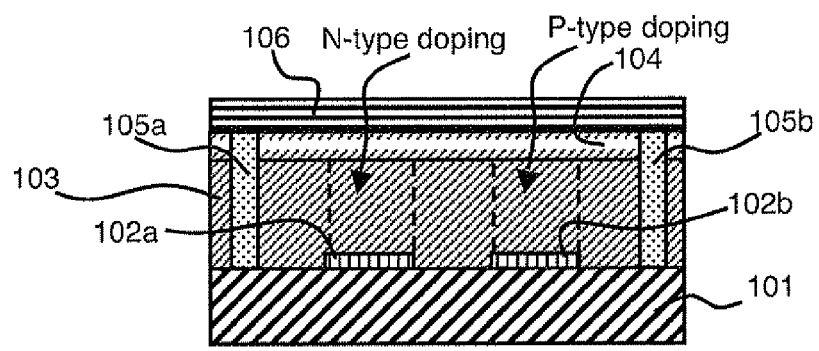

After formation of pillars 105a, 105b, a second sacrificial layer 106 is deposited on first sacrificial layer 104 as illustrated in FIG. 14. Second sacrificial layer 106 is preferably made from a different material than that of first sacrificial layer 104 to enable selective etching of the different layers.

Figure 15:
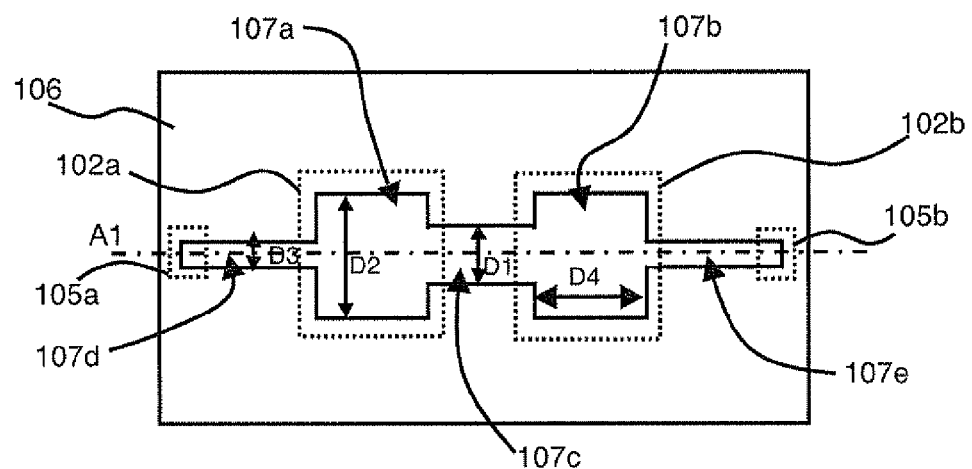

Second sacrificial layer 106 is then patterned according to a pattern. FIG. 15 illustrates a top view of the stack, the first visible layer therefore being second sacrificial layer 106. On this second sacrificial layer 106, the pattern presents a longitudinal axis A1 which passes via the two pillars 105a, 105b. This pattern can be in the form of a beam comprising two areas 107a, 107b arranged above electric connectors 102a, 102b. These two areas 107a, 107b are connected to one another by a central portion 107c of the beam. The beam further comprises a lateral portion 107d connected to one of the areas 107a and passing above one of the pillars 105a.

Another lateral portion 107e is connected to another area 107b and passes above the other pillar 105b.

Figure 16:
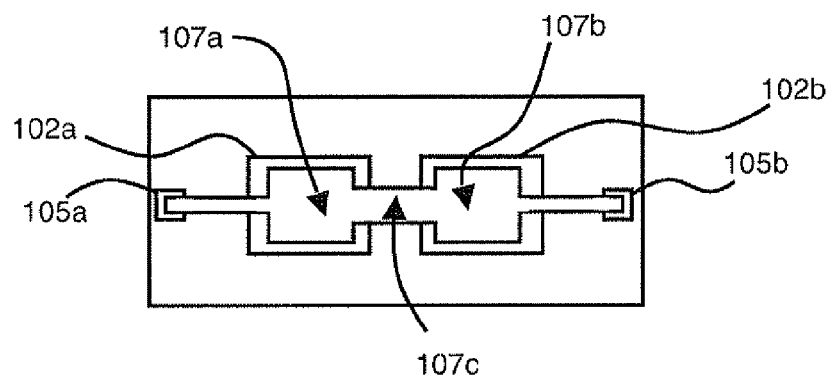

This patterning according to the pattern which comprises the designs of the two areas 107a, 107b, of the central portion 107c and of the lateral portions 107d, 107e then enables selective etching to be performed, for example etching by anisotropic plasma using the patterning of second sacrificial layer 106 as hard mask, of first sacrificial layer 104 and of thermoelectric material layer 103 up to the support substrate 101 or to the connectors 102a, 102b. FIG. 16 illustrates a top view of the stack after anisotropic etching where it can be observed that the pillars and connectors 102a, 102b have been released.

Figure 17:
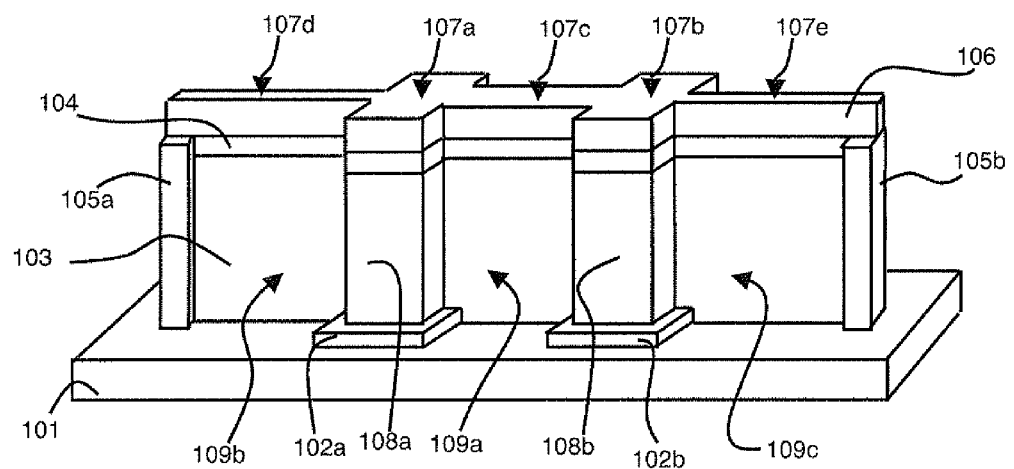
FIGS. 17 and 18 illustrate in three dimensions a product obtained following the first part of steps.

As illustrated in a three-dimensional view in FIG. 17, the future legs 108a, 108b are both connected to one another by a first wall 109a, at the level of central portion 107c, and are respectively connected to pillars 105a, 105b by a second and third wall 109b, 109c at the level of the associated lateral portion 107d, 107e. Legs 108a, 108b can be released by any type of method known to the person skilled in the art, for example by ion implantation followed by etching.

Figure 18:
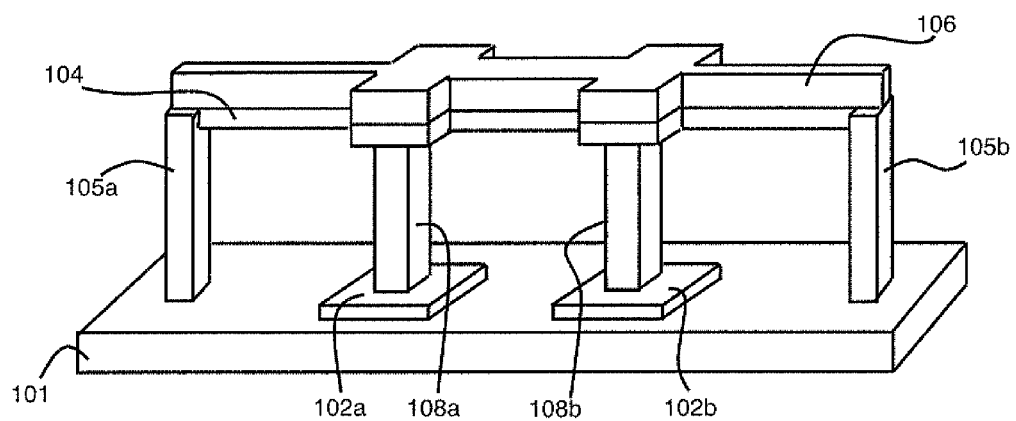

In the particular example of FIGS. 15 to 18, pattern 107a, 107b, 107c, 107d, 107e is shaped so as to facilitate formation and releasing of legs 108a, 108b by isotropic etching. After isotropic etching in accordance with pattern 107a, 107b, 107c, 107d, 107e, legs 108a, 108b are thus connected to one another by first wall 109a, leg 108a is connected to pillar 105a by second wall 109b, and leg 108b is connected to pillar 105b by third wall 109c (FIG. 17). Isotropic etching of thermoelectric layer 103 allow to remove walls 109a, 109b, 109c (FIG. 18). In this example, lateral portions 107d, 107e, central portion 107c and areas 107a, 107b respectively have widths D3, D1 and D2 (FIG. 15), perpendicular to the longitudinal axis A1 passing through the two pillars 105a, 105. The dimensions D1 and D3 are preferably identical, and the dimension D2 of areas 107a, 107b is larger than the largest dimension between D1 and D3. In the same way, the dimension D4 of areas 107a, 107b along the longitudinal axis A1 is larger than the largest dimension between D1 and D3. These constraints then enable legs 108a, 108b to be released, after anisotropic etching of the pattern, as illustrated in FIG. 18 by isotropic etching of thermoelectric layer 103, the legs then being thinned. In other words, in general manner, the legs can be formed by deposition of a thermoelectric material layer 103 on support substrate 101, followed by formation of an etching pattern having a longitudinal direction and comprising two areas 107a, 107b joined by a central portion 107c, the transverse and longitudinal dimensions of areas 107a, 107b being greater than the transverse dimension of central portion 107c. Thermoelectric material layer 103 is then etched by means of the etching pattern, and finally thermoelectric material layer 103 is partially etched in isotropic manner to release legs 108a, 108b.

After legs 108a, 108b have been released, the whole assembly is preferably sunk in a third sacrificial layer 110 forming the packaging layer referred to in the foregoing. This third sacrificial layer 110 is preferably formed from a different material from first and second sacrificial layer 104, 106. As indicated beforehand, the choice of different materials will subsequently enable the different sacrificial layers to be selectively etched. Third sacrificial layer 110 is then smoothed to form a flat surface with second sacrificial layer 106, for example by CMP, or CMP followed by etching.

Figure 19:
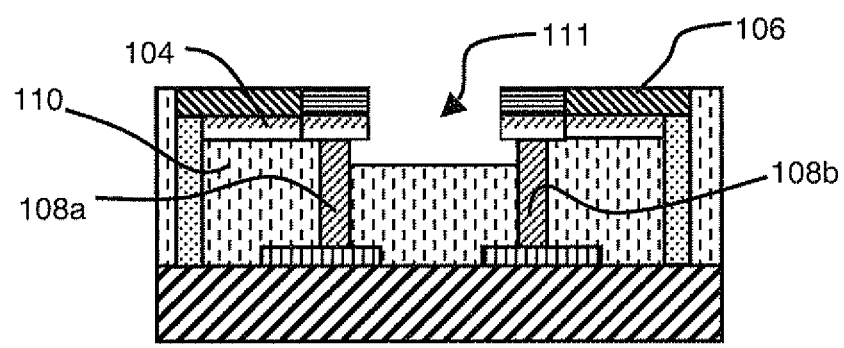
FIGS. 19 to 22 illustrate a second part of steps of the method.

It is then possible, as illustrated in FIG. 19 which is a cross-sectional view of the stack, to form an open cavity 111 in the stack by selectively etching second sacrificial layer 106, first sacrificial layer 104, and a part of third sacrificial layer 110, according to the pattern of central portion 107c. Third sacrificial layer 110 is preferably etched in isotropic manner until it is flush with the side flanks of first and second legs 108a, 108b in cavity 111. Cavity 111 can then be filled by an electrically conducting material which will form both a part of the connecting element and of the membrane. Finally, first sacrificial layer 104 and third sacrificial layer 110 can be removed, the membrane then being partly formed by second sacrificial layer 106 which is not totally removed.

In other words, etching pattern 107a, 107b, 107c, 107d, 107e can be formed by a bottom first sacrificial layer 104 and a top second sacrificial layer 106. The packaging layer, formed in the present case by third sacrificial layer 110, forms a common flat surface with second sacrificial layer 106. Then cavity 111 is formed by elimination of the etching pattern at the level of central portion 107c up to the packaging layer, and by removal of a part of the packaging layer at least under a part of central portion 107c.

Figure 20:
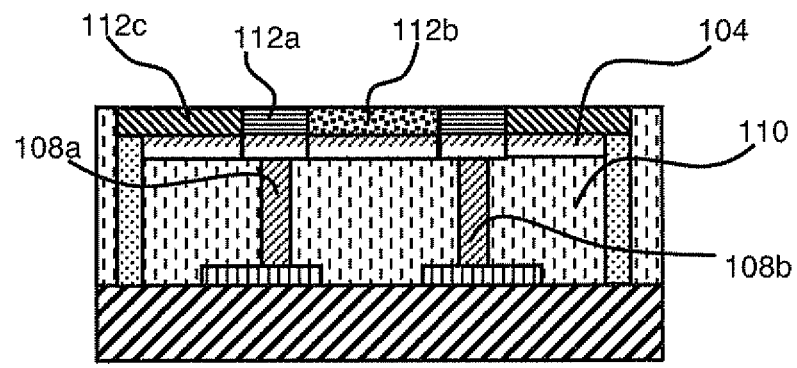

According to a preferred embodiment illustrated in FIGS. 19 and 20, after smoothing of third sacrificial layer 110, second sacrificial layer 106 is selectively eliminated up to first sacrificial layer 104. This step (not represented) enables an open cavity to be delineated having a general shape that is the same as that of the previously defined pattern. In other words, the cavity has a shape delineated by the two areas 107a, 107b, central portion 107c and lateral portions 107d, 107e. In FIG. 20, the two areas 107a, 107b, central portion 107c and lateral portions 107d, 107e are preferably respectively filled by first, second and third materials 112a, 112b, 112c.

The following example gives a method able to be used to fill areas 107a, 107b and portions 107c, 107d, 107e with different materials. In the example, the dimension D1 of central portion 107c is greater than twice the dimension D3 of lateral portions 107e, 107d, and the dimension D2 of areas 107a, 107b and the dimension D4 of areas 107a, 107b are greater than twice the dimension defined by the width D1 (FIG. 15). This enables lateral portions 107d, 107e to be filled in a first stage by depositing a layer of third material 112c of equivalent thickness to half of D3, by conformal deposition, and by removing third material 112c at the level of areas 107a, 107b and of central portion 107c over a thickness equal to half of D3, without removing third material 112c from lateral portions 107d, 107e. Then in a second step, central portion 107c is filled by depositing a layer of second material 112b of equivalent thickness to half of D1, by conformal deposition. Second material 112b is then removed at the level of areas 107a, 107b over a thickness equal to half of D1 without removing second material 112b from central portion 107c. Finally, areas 107a, 107b can be filled with first material 112a.

FIG. 19 illustrates the next step in the course of which a cavity 111 is formed by removal of second material 112b, of first sacrificial layer 104 at the level of central portion 107c, and of a part of the sacrificial layer 110 until it is flush with the lateral flanks of first and second legs 108a, 108b in cavity 111. Removal of the part of third sacrificial layer 110 is preferably performed by isotropic etching to enable the legs to be flush in cavity 111.

Figure 21:
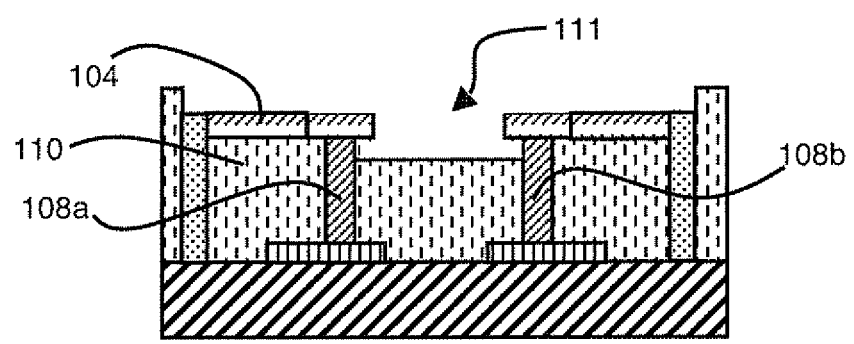

In FIG. 21, first and third materials 112a, 112b are selectively eliminated until they are flush with the rest of sacrificial layer 104.

Figure 22:
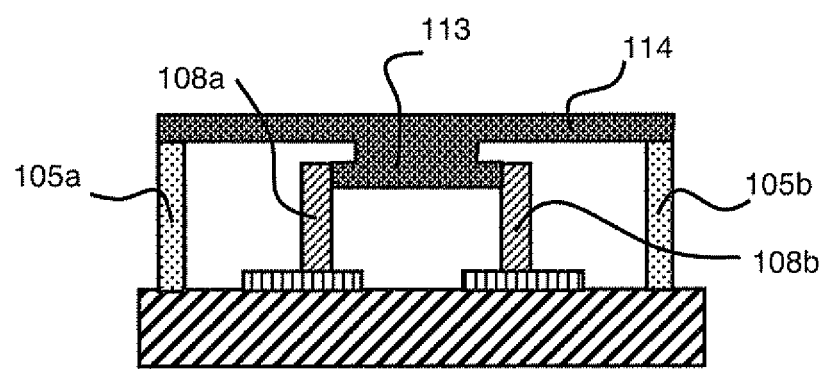

The last step illustrated in FIG. 22 consists in forming connecting element 113 between the two legs 108a, 108b, said connecting element 113 being in contact with said legs 108a, 108b, and in forming membrane 114 supporting said connecting element 113. Membrane 114 is anchored to the apexes of support pillars 105a, 105b. To finish, the rest of first and third sacrificial layers 104, 110 is selectively removed.

According to an alternative embodiment, the first and third materials are not eliminated, and cavity 111 is directly filled by an electrically conducting material. Membrane 114 is then formed by the first and third materials and the material filling the cavity. Finally the rest of first and third sacrificial layers 104, 110 is selectively removed to obtain the final device.

According to a development, the thermoelectric device comprises formation of several thermocouples as described in the foregoing. The membrane and the connecting elements are then formed in two steps with interposition of an electrically insulating layer between each element and the membrane so as to prevent short-circuiting of the thermocouples.

According to an alternative embodiment that is not represented, after formation of the connecting element, a hole is formed in the latter in the direction of the support substrate. This hole is then filled by a volume change material to form the means to make the thickness of the connecting element vary.

The invention claimed is:

1. A thermoelectric device comprising:
   a thermocouple comprising:
   a first leg made from a first material, the first leg being provided with a first end anchored to a support, and with a first surface,
   a second leg made from a second material, the second leg being provided with a first end anchored to said support, and with a second surface facing the first surface, and
   an electrically conductive element arranged only between the first surface and the second surface, the electrically conductive element having a first contact area in electrical contact with the first leg on the first surface and a second contact area in electrical contact with the second leg on the second surface; and
   a membrane provided with a surface facing the support, the membrane being arranged so as to place the thermocouple between the membrane surface and the support, wherein
   the electrically conductive element is positioned on the surface of the membrane, and
   the membrane is configured to deform so as to slide the electrically conductive element along the first leg and the second leg and between the first surface and the second surface, so as to move the first contact area from a first position to a second position on the first surface, and so as to move the second contact area from a first position to a second position on the second surface.

2. The device according to claim 1, wherein the electrically conductive element comprises an element made from a material configured to expand or retract so as to modify a dimension measured along an axis crossing the first surface and the second surface.

3. The device according to claim 2, wherein the material of the element is configured to change volume by an action of an electric stimulation, a thermic stimulation, or an optic stimulation.

4. The device according to claim 1, wherein:
   the thermoelectric device forms a Seebeck effect thermoelectric device when the first contact area and the second contact area are respectively in the first position on the first surface and the first position on the second surface, and
   the thermoelectric device forms a Peltier effect thermoelectric device when the first contact area and the second contact area are respectively in the second position on the first surface and in the second position on the second surface.

5. A method of fabricating the thermoelectric device of claim 1, the method comprising:
   forming the first leg and the second leg from thermoelectric material, electrically insulated from one another, on a surface of a substrate; and
   forming the movable electrically conductive element such that the movable electrically conductive element electrically connects the first leg and the second leg and is configured to move in a direction perpendicular to the surface of the substrate.

6. The method according to claim 5, comprising after forming the first leg and the second leg:
   depositing a packaging layer;
   etching the packaging layer between the two legs so as to (i) free an end of sidewalls of each the first leg and the second leg, and (ii) define a void; and
   depositing an electrically conductive material so as to fill the void and form the movable element connecting the first leg and the second leg.

7. The method according to claim 6, wherein the first leg and the second leg are formed by the following steps:
   depositing a layer of thermoelectric material;
   forming an etching mask made of a first material and defining two main areas connected by a central portion in a longitudinal direction, each main area having a dimension in the longitudinal direction and a dimension in a transverse direction greater than a dimension of the central portion measured in the transverse direction, the transverse direction being perpendicular to the longitudinal direction;
   etching the thermoelectric material so as to define the first leg and the second leg by means of the main areas; and
   partially etching the thermoelectric material layer in an isotropic manner to release the legs.

8. The method according to claim 7, wherein:
   the etching mask comprises a top sacrificial layer formed on a bottom sacrificial layer, and
   the packaging layer is planarized so as to form a common flat surface with the top sacrificial layer, and
   the method further comprises etching the central portion and a part of the packaging layer so as to form the void.

9. The method according to claim 5, wherein the first leg and the second leg are formed by the following steps:
   depositing a layer of thermoelectric material;
   forming an etching mask made of a first material and defining two main areas connected by a central portion in a longitudinal direction, each of the main areas having a dimension in the longitudinal direction and a dimension in a transverse direction greater than a dimension of the central portion measured in the transverse direction, the transverse direction being perpendicular to the longitudinal direction;
   etching the thermoelectric material so as to define the first leg and the second leg by means of the main areas; and
   partially etching the thermoelectric material layer in an isotropic manner to release the legs.

10. The method according to claim 5, further comprising forming a first pillar and a second pillar before forming the first leg and the second leg between the first pillar and the second pillar, wherein the etching mask is supported by the first pillar and the second pillar by means of a first longitudinally extended portion and a second longitudinally extended portion.

11. A thermoelectric device comprising:
a thermocouple comprising:
- a first leg made from a first material, the first leg being provided with a first end anchored to a support, and with a first surface,
- a second leg made from a second material, the second leg being provided with a first end anchored to said support, and with a second surface facing the first surface, and
- an electrically conductive element arranged only between the first surface and the second surface, the electrically conductive element having a first contact area in electrical contact with the first leg on the first surface and a second contact area in electrical contact with the second leg on the second surface;

a membrane provided with a surface facing the support, the membrane being arranged so as to place the thermocouple between the membrane surface and the support, the electrically conductive element being positioned on the membrane surface; and an actuator configured to deform the membrane, so as to slide the electrically element along the first leg and the second leg and between the first surface and the second conductive element along the first leg and the second leg and between the first surface and the second, surface, so as to move the second contact area from a first position to a second position on the second surface.

* * * * *